United States Patent
Tamaru

(10) Patent No.: US 7,259,432 B2
(45) Date of Patent: Aug. 21, 2007

(54) SEMICONDUCTOR DEVICE FOR REDUCING PARASITIC CAPACITANCE PRODUCED IN THE VICINITY OF A TRANSISTOR LOCATED WITHIN THE SEMICONDUCTOR DEVICE

(75) Inventor: Masaki Tamaru, Kyoto (JP)

(73) Assignee: Matsushita Electric Industrisl Co., Ltd., Osaka (JP)

( * ) Notice: Subject to any disclaimer, the term of this patent is extended or adjusted under 35 U.S.C. 154(b) by 0 days.

(21) Appl. No.: 11/068,807

(22) Filed: Mar. 2, 2005

(65) Prior Publication Data

US 2005/0194637 A1  Sep. 8, 2005

(30) Foreign Application Priority Data

Mar. 3, 2004  (JP) .............................. 2004-058660

(51) Int. Cl.
*H01L 29/76* (2006.01)
*H01L 29/94* (2006.01)
*H01L 31/062* (2006.01)
*H01L 31/113* (2006.01)
*H01L 31/119* (2006.01)

(52) U.S. Cl. .................. 257/382; 257/324; 257/325; 257/326; 257/343; 257/383; 257/384; 257/385; 257/401; 257/522; 257/637; 257/638; 257/752; 257/902

(58) Field of Classification Search ........ 257/324–326, 257/401, 522, 637–638, 752, 343, 902, 382–385
See application file for complete search history.

(56) References Cited

U.S. PATENT DOCUMENTS

| | | | | |
|---|---|---|---|---|
| 5,717,236 A | * | 2/1998 | Shinkawata | 257/306 |
| 5,841,171 A | * | 11/1998 | Iwamatsu et al. | 257/347 |
| 5,925,912 A | * | 7/1999 | Arai et al. | 257/344 |
| 6,087,261 A | * | 7/2000 | Nishikawa et al. | 438/685 |
| 6,104,052 A | * | 8/2000 | Ozaki et al. | 257/296 |
| 6,177,320 B1 | * | 1/2001 | Cho et al. | 438/279 |
| 6,300,242 B1 | * | 10/2001 | Ueda et al. | 438/638 |
| 6,451,649 B2 | * | 9/2002 | An | 438/253 |
| 6,472,268 B1 | * | 10/2002 | Yoo | 438/253 |
| 6,511,877 B2 | * | 1/2003 | Kanaya et al. | 438/240 |
| 6,569,776 B2 | * | 5/2003 | Ueda | 438/724 |
| 6,737,308 B2 | * | 5/2004 | Kim | 438/197 |
| 6,784,084 B2 | * | 8/2004 | Kang et al. | 438/586 |
| 6,838,341 B2 | * | 1/2005 | Yoon et al. | 438/255 |
| 6,903,022 B2 | * | 6/2005 | Peng et al. | 438/697 |
| 6,924,229 B2 | * | 8/2005 | Cheong et al. | 438/639 |
| 2004/0124477 A1 | * | 7/2004 | Minami et al. | 257/379 |
| 2004/0147082 A1 | * | 7/2004 | Kim | 438/301 |
| 2004/0150054 A1 | * | 8/2004 | Hirano | 257/371 |
| 2004/0161919 A1 | * | 8/2004 | Cha et al. | 438/618 |
| 2004/0178479 A1 | * | 9/2004 | Saito | 257/632 |
| 2004/0188806 A1 | * | 9/2004 | Chung et al. | 257/621 |
| 2004/0201063 A1 | * | 10/2004 | Fukuda | 257/347 |

FOREIGN PATENT DOCUMENTS

JP  2002-208643  7/2002

* cited by examiner

*Primary Examiner*—Ida M. Soward
(74) *Attorney, Agent, or Firm*—McDermott Will & Emery LLP

(57) ABSTRACT

A semiconductor device includes: a gate electrode formed on a substrate; impurity regions formed in the substrate and to both sides of the gate electrode; a first interlayer insulating film formed to cover the gate electrode; and a second interlayer insulating film formed so as to be aligned in a direction parallel to the principal surface of the substrate and adjacent to the gate electrode with a part of the first interlayer insulating film interposed therebetween. The second interlayer insulating film has a lower relative permeability than the first interlayer insulating film.

16 Claims, 8 Drawing Sheets

US 7,259,432 B2

SEMICONDUCTOR DEVICE FOR REDUCING PARASITIC CAPACITANCE PRODUCED IN THE VICINITY OF A TRANSISTOR LOCATED WITHIN THE SEMICONDUCTOR DEVICE

CROSS-REFERENCE TO RELATED APPLICATIONS

This application claims priority under 35 U.S.C. § 119 on Patent Application No. 2004-58660 filed in Japan on Mar. 3, 2004, the entire contents of which are hereby incorporated by reference.

BACKGROUND OF THE INVENTION (1) Field of the Invention

The present invention relates to a semiconductor device reducing the parasitic capacitance produced in the vicinity of a transistor and a method for fabricating the same.

(2) Description of Related Art

In recent years, as semiconductor process rules become finer, it is becoming more difficult to control the dimensions of gate electrodes constituting part of MOS transistors. In particular, the difference in the density of a gate pattern causes the difference in the influence of optical proximity effect and etching characteristics. Therefore, the dimensions of finished gate electrodes vary depending on their surrounding features. This problem will be described with reference to FIGS. 8A through 8C.

FIG. 8A is a diagram showing an example of a plan configuration of a known semiconductor device in which dummy gates are formed to reduce variations in the dimensions of finished gate electrodes, and FIGS. 8B and 8C are cross-sectional views taken along the line VIIb-VIIb and the line VIIc-VIIc in FIG. 8A, respectively.

As shown in FIGS. 8A through 8C, in the structure of the known semiconductor device, an isolation region 11 is formed in the surface of a substrate 10 to section the substrate 10 into a plurality of transistor regions. The isolation region 11 is made of, for example, a $SiO_2$ film. A gate electrode 12 is formed on each transistor region of the substrate 10 with a gate insulating film 13 interposed therebetween. For example, N-type impurity regions 14 serving as source/drain regions are formed in each transistor region of the substrate 10 and to both sides of the gate electrode 12. To be specific, a first NMOS transistor TNa comprising a gate electrode 12a and impurity regions 14a and a second NMOS transistor TNb comprising a gate electrode 12b and impurity regions 14b are formed in the substrate 10 to be adjacent to each other with the isolation region 11 interposed between the first NMOS transistor TNa and the second NMOS transistor TNb.

The dummy gates 15 are formed on the isolation region 11 to be parallel to the gate electrodes 12. To be specific, a dummy gate 15a is formed on, out of parts of the isolation region 11 adjacent to the first NMOS transistor TNa, a part of the isolation region 11 located far from the second NMOS transistor TNb, a dummy gate 15b is formed on a part of the isolation region 11 interposed between the first NMOS transistor TNa and the second NMOS transistor TNb, and a dummy gate 15c is formed on, out of parts of the isolation region 11 adjacent to the second NMOS transistor TNb, a part of the isolation region 11 located far from the first NMOS transistor TNa.

The substrate 10, the isolation region 11, the gate electrodes 12, the gate insulating films 13, the N-type impurity regions 14, and the dummy gates 15 are covered with an interlayer insulating film 16 made of $SiO_2$. Contact plugs 17 are formed to both sides of each gate electrode 12 to reach the N-type impurity regions 14. To be specific, contact plugs 17a and 17b are formed to reach the N-type impurity regions 14a, and contact plugs 17c and 17d are formed to reach the N-type impurity regions 14b. The contact plugs 17 each have a structure in which a contact hole is filled with a refractory metal, such as tungsten.

In the structure of such a known semiconductor device, the difference in the density of a gate pattern is reduced by locating a dummy gate 15 a predetermined distance apart from the associated gate electrode 12. This reduces variations in optical proximity effect and etching characteristics due to the density difference and reduces variations in the dimensions of finished gates.

FIG. 9 is a plan view showing an example of the structure of a known semiconductor device in which dummy gates are formed to reduce variations in the dimensions of finished gate electrodes and furthermore dummy gates that are no longer required are utilized as interconnects.

In the structure of the semiconductor device shown in FIG. 9, an isolation region (not shown) is formed in a substrate (not shown) to section the substrate into a plurality of transistor regions. A gate electrode 12c is formed on the transistor regions of the substrate with gate insulating films (not shown) interposed therebetween. For example, N-type impurity regions 14 and P-type impurity regions 18 serving as source/drain regions are formed in the corresponding transistor regions of the substrate and to both sides of the gate electrode 12c. To be specific, an NMOS transistor TNc comprising the gate electrode 12c and the N-type impurity regions 14c and a PMOS transistor TP comprising the gate electrode 12c and the P-type impurity regions 18 are formed to be adjacent to each other with the isolation region interposed between the NMOS transistor TNc and the PMOS transistor TP.

In this case, the gate electrode 12c is a single gate electrode continuously formed over both the NMOS transistor TNc and the PMOS transistor TP.

A dummy gate 15d and a dummy gate 15e are formed on both the N-type impurity regions 14c, respectively, and a dummy gate 15d and the dummy gate 15e on both the P-type impurity regions 18, respectively. Each dummy gate 15d and the dummy gate 15e are formed in parallel to the gate electrode 12c. In this case, the dummy gates 15d are separately formed on one of the N-type impurity regions 14c and one of the P-type impurity regions 18. On the other hand, the dummy gate 15e is a single dummy gate continuously formed across both the adjacent NMOS and PMOS transistors TNc and TP.

The N-type impurity regions 14c, the P-type impurity regions 18, the gate electrode 12c, and the dummy gates 15d and 15e are insulated from one another by an interlayer insulating film (not shown) made of $SiO_2$. Contact plugs 17e and 17f are formed in the interlayer insulating film to reach the N-type impurity regions 14c of the NMOS transistor TNc and the P-type impurity regions 18 of the PMOS transistor TP. The contact plugs 17 each have a structure in which a contact hole is filled with a refractory metal such as tungsten. Furthermore, the contact plugs 17e and 17f are connected to the dummy gates 15d and 15e, respectively.

Although the dummy gates 15d and 15e are formed to reduce variations in the dimensions of the finished gate electrodes 12c, they are no longer required after the formation of the gate electrode 12c. To cope with this, the dummy gate 15e is connected to the contact plugs 17f on the associated impurity region 14c of the NMOS transistor TNc and the associated impurity region 18 of the PMOS transistor TP, thereby utilizing the dummy gate 15e as an interconnect. This can ensure a resource of an interconnect layer and improve integration density. For example, Japanese Unexamined Patent Publication No. 2002-208643 (page 10, FIG. 5) discloses the above-mentioned technique.

SUMMARY OF THE INVENTION

However, the structure of the known semiconductor device has the following problem.

In the structure of the semiconductor device shown in FIG. 8, dummy gates are formed a predetermined small distance apart from the gate electrode. Thus, each dummy gate 15 and the neighboring contact plug 17, each gate electrode 12 and the neighboring contact plug 17, and each gate electrode 12 and the neighboring dummy gate 15 each serve as a pair of electrodes. Each pair of electrodes constitutes a capacitor element with an interlayer insulating film 16 interposed therebetween. To be specific, for example, for the first NMOS transistor TNa, a pair of the dummy gate 15a and the contact plug 17a, a pair of the dummy gate 15b and the contact plug 17b, a pair of the gate electrode 12a and the dummy gate 15a, a pair of the gate electrode 12a and the dummy gate 15b, and other pairs each serve as a pair of electrodes. Each pair of electrodes constitutes a capacitor element with the interlayer insulating film 16 interposed between the electrodes. Also for the second NMOS transistor TNb, for example, a pair of the dummy gate 15b and the contact plug 17c, a pair of the dummy gate 15c and the contact plug 17d, a pair of the gate electrode 12b and the dummy gate 15b, a pair of the gate electrode 12b and the dummy gate 15c, and other pairs each serve as a pair of electrodes. Each pair of electrodes constitutes a capacitor element with the interlayer insulating film 16 interposed between the electrodes. Since such capacitor elements are formed, parasitic capacitances are applied on all of a gate, a source and a drain of the NMOS transistor, leading to the lowered speed of a switching operation.

In the structure of the semiconductor device shown in FIG. 9, the dummy gates 15d and 15e are formed a predetermined small distance away from the gate electrode 12c and electrically connected to a source or a drain. Furthermore, the dummy gates 15d and 15e are all formed parallel to the gate electrode 12c. The gate electrode 12c and each dummy gate 15d constitute a parallel plate capacitor element with an interlayer insulating film interposed therebetween. In view of the above, parasitic capacitances are applied between gates and sources of the NMOS transistor and the PMOS transistor and between gates and drains thereof, leading to the lowered speed of a switching operation.

Furthermore, for example, in the structure of the semiconductor device shown in FIG. 9, the dummy gates 15d and 15e are connected to interconnects through the contact plugs 17e and 17f, respectively. On the other hand, if unlike this structure the dummy gates 15d and 15e are not connected to interconnects, the dummy gates 15d and 15e become floating nodes (interconnects, diffusion regions or the like that are not connected anywhere). Since the floating nodes have no stable potential, it is difficult to model devices having floating nodes. Therefore, such devices cannot accurately be designed. This may cause misoperation.

In view of the above, it is an object of the present invention to provide a semiconductor device reducing variations in the dimensions of finished gate electrodes utilizing dummy gates and reducing the parasitic capacitances applied on a gate, a source and a drain of a transistor, thereby realizing a high-speed operation, low power consumption, and a stable operation, and a method for fabricating the same.

In order to achieve the above object, a semiconductor device of a first aspect of the present invention comprises: a gate electrode formed on a substrate; impurity regions formed in the substrate and to both sides of the gate electrode; a first interlayer insulating film formed to cover the gate electrode; and a second interlayer insulating film formed so as to be aligned in a direction parallel to the principal surface of the substrate and adjacent to the gate electrode with a part of the first interlayer insulating film interposed therebetween, wherein the second interlayer insulating film has a lower relative permeability than the first interlayer insulating film.

According to the semiconductor device of the first aspect, the first interlayer insulating film is formed to cover the gate electrode, and the second interlayer insulating film is formed to be adjacent to the gate electrode with a part of the first interlayer insulating film interposed therebetween. Furthermore, the second interlayer insulating film has a lower relative permeability than the first interlayer insulating film. To be specific, while the first interlayer insulating film is made of, for example, $SiO_2$ having a relative permeability of 4.2, the second interlayer insulating film is made of a low-k material, such as SiOC having a relative permeability of 2.9.

When in this case we say that the second interlayer insulating film has a low relative permeability, it means that the relative permeability of the second interlayer insulating film is lower than that of $SiO_2$, i.e., 4.2. In this relation, materials of which the first and second interlayer insulating films are made are not restrictive to $SiO_2$ and SiOC as described above, and the second interlayer insulating film need only have a lower relative permeability than the first interlayer insulating film.

Such a structure of the semiconductor device of the first aspect reduces the parasitic capacitance. To be specific, it reduces the parasitic capacitance produced by interposing an interlayer insulating film between respective gate electrodes of adjacent two of a plurality of transistors formed on the substrate (for example, a gate electrode formed in a first transistor and a gate electrode formed in a second transistor adjacent to the first transistor). The reason for this is that in the structure of the semiconductor device of the first aspect, a part of the interlayer insulating film formed between the gate electrodes partly becomes the second interlayer insulating film having a low relative permeability.

Furthermore, according to the semiconductor device of the first aspect, the parasitic fringe capacitance is reduced which is produced by interposing the interlayer insulating film between each gate electrode and a source or drain. The reason for this is that for the semiconductor device of the first aspect, a part of the interlayer insulating film between each gate electrode and the source or drain becomes the second interlayer insulating film having a low relative permeability. In this relation, the fringe capacitance is a capacitance added to an approximate value of the parallel plate capacitance by the influence of the two-dimensional or three-dimensional electric field distribution.

Since as described above the semiconductor device of the first aspect can reduce the parasitic capacitance, this can restrain the speed of a switching operation from being lowered and can reduce the power consumption.

In this relation, a low-k material might be inferior in mechanical strength and adhesion to a conventionally used material of an interlayer insulating film, such as $SiO_2$.

However, since in the semiconductor device of the first aspect a low-k material is locally buried in the interlayer insulating film made of a conventionally used material, such as $SiO_2$, this ensures reliability.

Furthermore, in the semiconductor device of the first aspect, the second interlayer insulating film may be formed on the impurity region.

It is preferable that the semiconductor device of the first aspect further comprises an isolation region formed in the substrate to surround the impurity regions.

In the semiconductor device of the first aspect, the second interlayer insulating film may be formed on the isolation region or across the border between the impurity region and the isolation region.

The effects of the semiconductor device of the first aspect can sufficiently be obtained if the second interlayer insulating film is formed at any of the above-mentioned regions and sites.

Contact plugs are preferably formed in the first interlayer insulating film to reach the impurity regions.

This allows the impurity regions to be connected through the contact plugs to interconnects. Furthermore, the parasitic capacitance is produced between respective contact plugs of adjacent two of a plurality of transistors (for example, a contact plug connected to a first transistor and a contact plug connected to a second transistor adjacent to the first transistor) with the interlayer insulating film interposed therebetween. However, the use of the semiconductor device of the first aspect can reduce the parasitic capacitance. The reason for this is that in the structure of the semiconductor device of the first aspect, a part of the interlayer insulating film formed between the two contact plugs can at least partly be the second interlayer insulating film having a low relative permeability.

Furthermore, a parasitic fringe capacitance is produced by interposing the interlayer insulating film and the isolation region between each contact plug and the substrate. However, the semiconductor device of the first aspect reduces the parasitic capacitance. The reason for this is that in the semiconductor device of the first aspect, a part of the interlayer insulating film formed between each contact plug and the substrate can at least partly be the second interlayer insulating film having a low relative permeability.

Since as described above the parasitic capacitance can be reduced, this can restrain the speed of the switching operation from being lowered and reduce the power consumption.

The contact plugs may be formed not in the first interlayer insulating film but in the second interlayer insulating film to reach the impurity regions. Alternatively, they may be formed across the border between the first interlayer insulating film and the second interlayer insulating film.

If the contact plugs are formed at any of the above-mentioned sites, the same effect as in the case where the contact plugs are formed in the first interlayer insulating film can be obtained.

A semiconductor device of a second aspect of the present invention comprises: a gate electrode formed on a substrate; impurity regions formed in the substrate and to both sides of the gate electrode; an interlayer insulating film formed to cover the gate electrode; and a hollow region formed so as to be aligned in a direction parallel to the principal surface of the substrate and adjacent to the gate electrode with a part of the interlayer insulating film interposed therebetween.

According to the semiconductor device of the second aspect, the first interlayer insulating film is formed to cover the gate electrode, and the hollow region is formed so as to be aligned in a direction parallel to the principal surface of the substrate and adjacent to the gate electrode with a part of the first interlayer insulating film interposed therebetween.

In this relation, although the relative permeability of the interlayer insulating film made of, for example, $SiO_2$ is 4.2 and the relative permeability of SiOC known as a low-k material is 2.9, the relative permeability of the hollow region is a low value of almost 1.

Such a structure of the semiconductor device of the second aspect reduces the parasitic capacitance. To be specific, it reduces the parasitic capacitance produced by interposing an interlayer insulating film between respective gate electrodes of adjacent two of a plurality of transistors formed on the substrate (for example, a gate electrode formed in a first transistor and a gate electrode formed in a second transistor adjacent to the first transistor). The reason for this is that in the structure of the semiconductor device of the second aspect, the hollow region having a low relative permeability is formed in a part of the interlayer insulating film formed between the gate electrodes.

Furthermore, according to the semiconductor device of the second aspect, the parasitic fringe capacitance is reduced which is produced by interposing the interlayer insulating film between each gate electrode and a source or drain. The reason for this is that for the semiconductor device of the second aspect, the hollow region having a low relative permeability is formed in a part of the interlayer insulating film.

Since as described above the semiconductor device of the second aspect can reduce the parasitic capacitance, this can restrain the speed of the switching operation from being lowered and reduce the power consumption.

In this relation, the formation of the hollow region might deteriorate mechanical strength and the like. However, since in the semiconductor device of the second aspect the hollow region is locally formed in the interlayer insulating film made of a conventionally used material, such as $SiO_2$, this ensures reliability.

In the semiconductor device of the second aspect, the hollow region may be formed on the impurity region. The semiconductor device of the second aspect may further comprise an isolation region formed in the substrate to surround the impurity regions, wherein the hollow region may be formed on the isolation region. The semiconductor device of the second aspect may further comprise an isolation region formed in the substrate to surround the impurity regions, wherein the hollow region may be formed across the border between the impurity region and the isolation region.

If the second interlayer insulating film is formed at any of the above-mentioned sites, the effects of the semiconductor device of the second aspect can sufficiently be obtained.

Contact plugs are preferably formed in the interlayer insulating film to reach the impurity regions.

This allows the impurity regions to be connected through the contact plugs to interconnects. Furthermore, the parasitic capacitance is produced between respective contact plugs (for example, a contact plug connected to a first transistor and a contact plug connected to a second transistor adjacent to the first transistor) of adjacent two of a plurality of transistors with the interlayer insulating film interposed therebetween. However, the structure of the semiconductor device of the second aspect can reduce the parasitic capacitance. The reason for this is that in the structure of the semiconductor device of the second aspect, the hollow region having a low relative permeability is formed in a part of the interlayer insulating film formed between the two contact plugs.

Furthermore, a parasitic fringe capacitance is produced by interposing the interlayer insulating film and the isolation region between each contact plug and the substrate. However, the semiconductor device of the second aspect reduces the parasitic capacitance. The reason for this is that in the semiconductor device of the second aspect, the hollow region having a low relative permeability is formed in a part of the interlayer insulating film formed between each contact plug and the substrate.

Since as described above the parasitic capacitance can be reduced, this can restrain the speed of the switching operation from being lowered and reduce the power consumption.

The contact plugs may be formed not in the interlayer insulating film but in the hollow region and a part of the interlayer insulating film located on the hollow region to reach the impurity regions. Alternatively, they may be formed across the border between a combination of the hollow region and a part of the first interlayer insulating film located on the hollow region and the interlayer insulating film.

If the contact plugs are formed at any of the above-mentioned sites, the same effect as in the case where the contact plugs are formed in the interlayer insulating film can be obtained.

A method for fabricating a semiconductor device of the present invention comprises: the first step of forming, on a substrate, a gate electrode and a dummy gate parallel to the gate electrode; the second step of forming a first interlayer insulating film on the substrate on which the gate electrode and the dummy gate are formed; the third step of removing a part of the first interlayer insulating film located on at least one part of the dummy gate; and the fourth step of removing the dummy gate after the third step.

According to the method for fabricating a semiconductor device of the present invention, the formation of the dummy gates reduces the difference in the density of a gate pattern. As a result, the variations in optical proximity effect and etching characteristics due to the difference in the density of the gate pattern are reduced. This can reduce variations in the dimensions of finished gates.

Furthermore, the first interlayer insulating film is formed on the substrate, and then a part of the first interlayer insulating film located on at least one part of the dummy gate is removed. Therefore, the dummy gate that is no longer required after the formation of the gate electrode can be removed. If the dummy gate is left without being removed, the parasitic capacitance is produced between the dummy gate and the associated contact plug, and the parasitic capacitance is again produced between the dummy gate and the gate electrode. However, since the removal of the dummy gate does not allow the parasitic capacitance to be produced, this can reduce the parasitic capacitance of the semiconductor device. As a result, the speed of the switching operation can be restrained from being lowered and the power consumption can be reduced.

When the dummy gate is left without being removed, the left dummy gate becomes a floating node except in the case where the dummy gate is connected to an interconnect. It is preferable that no floating node exists, because the floating node causes misoperation. According to the method of the present invention, the removal of the dummy gate can prevent a floating node from being produced. This can improve the stability of the operation of the semiconductor device.

It is preferable that the third step includes the step of removing a part of the first interlayer insulating film along the direction of extension of the dummy gate and the method further comprises the step of, after the fourth step, forming a second interlayer insulating film in a region in which the dummy gate and a part of the first interlayer insulating film have been removed.

According to this method, the dummy gate can easily be removed, and the second interlayer insulating film can be formed to be adjacent to the gate electrode with a part of the first interlayer insulating film interposed therebetween.

The second interlayer insulating film is preferably made of a material having a lower relative permeability than a material constituting the first interlayer insulating film.

To be specific, it is preferable that while the first interlayer insulating film is formed of, for example, $SiO_2$ having a relative permeability of 4.2, the second interlayer insulating film is formed of, for example, a low-k material, such as SiOC, having a relative permeability of 2.9.

Thus, the semiconductor device of the first aspect of the present invention can be fabricated. Since in the structure of the semiconductor device of the first aspect a part of the interlayer insulating film becomes the second interlayer insulating film having a low relative permeability as described above, this reduces the parasitic capacitance produced in the semiconductor device. In addition, the removal of the dummy gate also reduces the parasitic capacitance. As a result, a semiconductor device providing a high-speed operation and a low power consumption can be realized. Furthermore, the removal of the dummy gate does not provide any floating node, resulting in the improved stability of the operation of the semiconductor device.

It is preferable that the third step includes the step of removing a part of the first interlayer insulating film along the direction along which the dummy gate extends and the method further comprises the step of, after the fourth step, forming a second interlayer insulating film such that a hollow region is also formed in a region in which the dummy gate and a part of the first interlayer insulating film have been removed.

Thus, the dummy gate can easily be removed, and the hollow region can be formed to be adjacent to the gate electrode with the first interlayer insulating film interposed therebetween. This structure is the structure of the semiconductor device of the second aspect of the present invention. Since as described above the hollow region having a low relative permeability is formed in the interlayer insulating film, this reduces the parasitic capacitance produced in the semiconductor device. In addition, the removal of the dummy gate also reduces the parasitic capacitance. As a result, a semiconductor device providing a high-speed operation and low power consumption can be realized. Furthermore, the removal of the dummy gate does not provide any floating node, resulting in the improved stability of the operation of the semiconductor device.

It is preferable that the third step includes the step of forming a first contact hole in the first interlayer insulating film to reach the dummy gate and the fourth step includes the step of removing the dummy gate through the first contact hole.

Thus, the dummy gate can be removed, and the hollow region can be formed to be adjacent to the gate electrode with the first interlayer insulating film interposed therebetween. This structure is of the semiconductor device of the second aspect of the present invention. Since as described above the hollow region having a low relative permeability is formed in the interlayer insulating film, this reduces the parasitic capacitance produced in the semiconductor device. In addition, the removal of the dummy gate also reduces the parasitic capacitance. As a result, a semiconductor device providing a high-speed operation and a low power consumption can be realized. Furthermore, the removal of the dummy gate does not provide any floating node, resulting in the improved stability of the operation of the semiconductor device.

It is preferable that the method further comprises the steps of: before the second step, forming impurity regions in the substrate so as to be surrounded by the isolation region; and after the fourth step including the step of removing the dummy gate through a first contact hole, forming second contact holes in the first interlayer insulating film to reach the impurity regions.

Thus, the contact plugs are formed in the second contact holes, and the impurity regions are connected through the second contact plugs to interconnects.

It is preferable that the method further comprises the step of, before the second step, forming impurity regions in the substrate so as to be surrounded by the isolation region, wherein the third step including the step of forming a first contact hole in the first interlayer insulating film to reach the dummy gate includes the step of forming second contact holes in the first interlayer insulating film to reach the impurity regions.

Thus, the first contact hole and the second contact holes can be formed at the same time. This can reduce the number of semiconductor device fabricating process steps as compared with the case where the first contact hole and the second contact holes are formed separately.

Each second contact hole may be formed not in the first interlayer insulating film but in the hollow region and a part of the interlayer insulating film located on the hollow region. Alternatively, it may be formed across the border between a combination of the hollow region and a part of the interlayer insulating film located on the hollow region and the interlayer insulating film.

If the second contact hole is formed at any of the above-mentioned sites, the same effect as in the case where the contact hole is formed in the interlayer insulating film can be obtained.

It is preferable that the semiconductor device of the first or second aspect further comprises: LDD (Lightly Doped Drain) regions formed in regions of the substrate located to both sides of the gate electrode; sidewalls formed on both sides of the gate electrode; and a liner film formed to cover the substrate, the gate electrode and the sidewalls.

Thus, also for the semiconductor device formed with the LDD regions and the sidewalls for the purpose of reducing the short channel effect or other purposes, the effects of the present invention can be realized.

As described above, according to the present invention, variations in the dimensions of finished gates can be reduced by utilizing the dummy gate. In addition, the parasitic capacitance due to the dummy gate can be cancelled by removing the dummy gate after the formation of the gate electrode. Furthermore, the removal of the dummy gate can prevent a floating node from being produced, resulting in the stabilized operation of the semiconductor device.

Furthermore, the parasitic capacitance applied on a gate, a source and a drain of a transistor and the contact plugs can be reduced by replacing a part of the interlayer insulating film with the interlayer insulating film having a low relative permeability or the hollow region. Since in this way the parasitic capacitance can be reduced, a semiconductor device providing a high-speed operation and a low power consumption can be realized.

BRIEF DESCRIPTION OF THE DRAWINGS

FIG. 1A is a plan view showing the same, and FIGS. 1B and 1C are cross-sectional views taken along the line Ib-Ib and the line Ic-Ic in FIG. 1A, respectively.

FIG. 6A is a plan view showing the same, FIGS. 6B and 6C are cross-sectional views taken along the line Vb-Vb and Vc-Vc in FIG. 6A, respectively.

FIG. 8A is a plan view showing the same, and FIGS. 8B and 8C are cross-sectional views taken along the line VIIb-VIIb and the line VIIc-VIIc in FIG. 8A, respectively.

DETAILED DESCRIPTION OF THE INVENTION

Embodiment 1

A semiconductor device according to a first embodiment of the present invention and a method for fabricating the same will be described hereinafter with reference to the drawings.

Figure 1A:
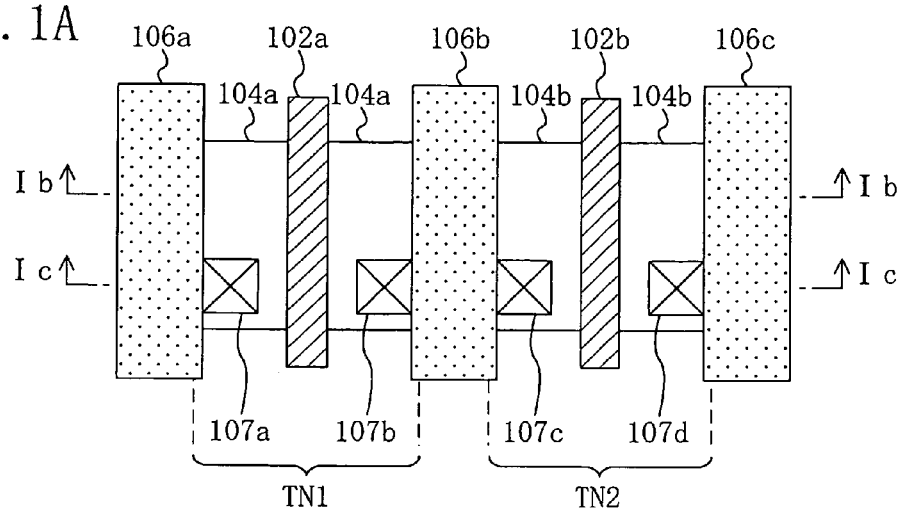
FIGS. 1A through 1C are diagrams showing the structure of a semiconductor device according to a first embodiment of the present invention.
Figure 1B:
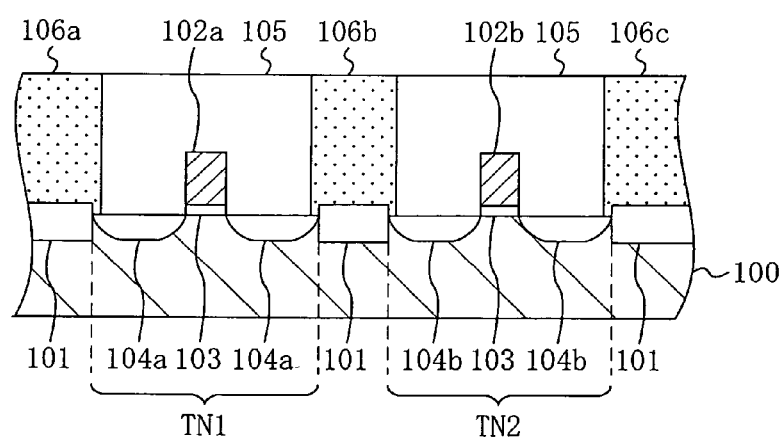
Figure 1C:
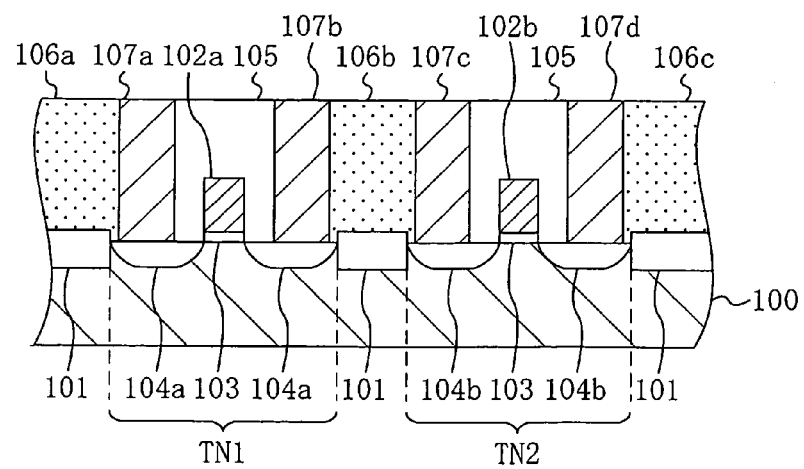

FIGS. 1A through 1C are diagrams showing the structure of the semiconductor device according to the first embodiment of the present invention. FIG. 1A is a plan view showing the same, and FIGS. 1B and 1C are cross-sectional views taken along the line Ib-Ib and the line Ic-Ic in FIG. 1A, respectively.

As shown in FIGS. 1A through 1C, an isolation region 101 is formed in a substrate 100 to section the substrate 100 into a plurality of transistor regions. The isolation region 101 is made of, for example, a $SiO_2$ film. A gate electrode 102 is formed on each transistor region of the substrate 100 with a gate insulating film 103 interposed therebetween. For example, N-type impurity regions 104 serving as source/drain regions are formed in each transistor region of the substrate 100 and to both sides of the gate electrode 102. To be specific, a first NMOS transistor TN1 comprising the gate electrode 102a and the impurity regions 104a and a second NMOS transistor TN2 comprising the gate electrode 102b and the impurity regions 104b are formed in the substrate 100 to be adjacent to each other with the isolation region 101 interposed between the first NMOS transistor TN1 and the second NMOS transistor TN2.

A first interlayer insulating film 105 is formed on the impurity regions 104 to cover the gate electrodes 102. The first interlayer insulating film 105 is made of, for example, a $SiO_2$ film. Second interlayer insulating films 106 are formed so as to be aligned in a direction parallel to the principal surface of the substrate 100 and adjacent to the gate electrodes 102 with parts of the first interlayer insulating film 105 interposed therebetween, respectively. The second interlayer insulating films 106 are made of films having a lower relative permeability than the first interlayer insulating film 105, such as a SiOC film. To be specific, a part of the first interlayer insulating film 105 covering the gate electrode 102a of the first NMOS transistor TN1 is interposed between a second interlayer insulating film 106a located far from the second NMOS transistor TN2 and a second interlayer insulating film 106b located on one side of the second NMOS transistor TN2. A part of the first interlayer insulating film 105 covering the gate electrode 102b of the second NMOS transistor TN2 is interposed between the second interlayer insulating film 106b located on one side of the first NMOS transistor TN1 and a second interlayer insulating film 106c located far from the first NMOS transistor TN1.

Contact plugs 107 are formed in the first interlayer insulating film 105 to reach the N-type impurity regions 104 of the transistors. To be specific, contact plugs 107a and 107b are formed in the first NMOS transistor TN1 to reach the impurity regions 104a, and contact plugs 107c and 107d are formed in the second NMOS transistor TN2 to reach the impurity regions 104b. The contact plugs 107 each have a structure in which a contact hole is filled with a refractory metal, such as tungsten.

FIGS. 2A through 2C, 3A, and 3B are cross-sectional views showing a method for fabricating a semiconductor device according to the first embodiment.

Figure 2A:
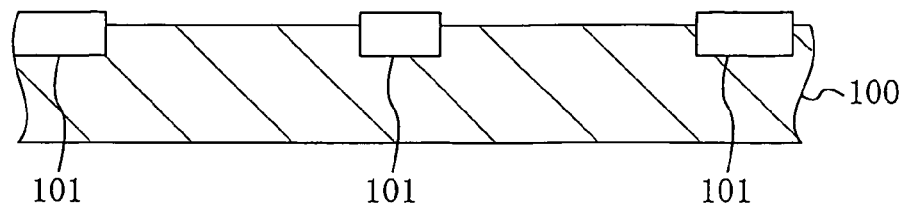
FIGS. 2A through 2C are cross-sectional views showing some of process steps of a method for fabricating a semiconductor device according to the first embodiment and a second embodiment of the present invention (until the step of forming a first interlayer insulating film).

As shown in FIG. 2A, an isolation region 101 is previously formed in a substrate 100 by selective oxidation or the like.

Figure 2B:
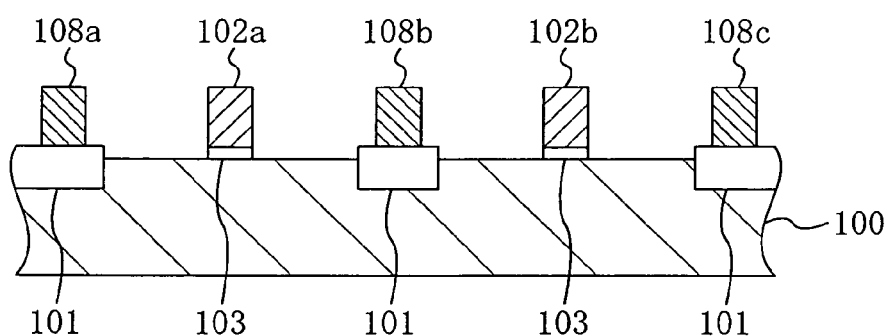

Next, as shown in FIG. 2B, gate insulating films 103 and a conductive film that will be gate electrodes 102 and dummy gates 108 are successively formed on the substrate 100, and thereafter the conductive film is patterned by known photolithography and etching techniques, thereby forming the gate electrodes 102 and the dummy gates 108.

Figure 2C:
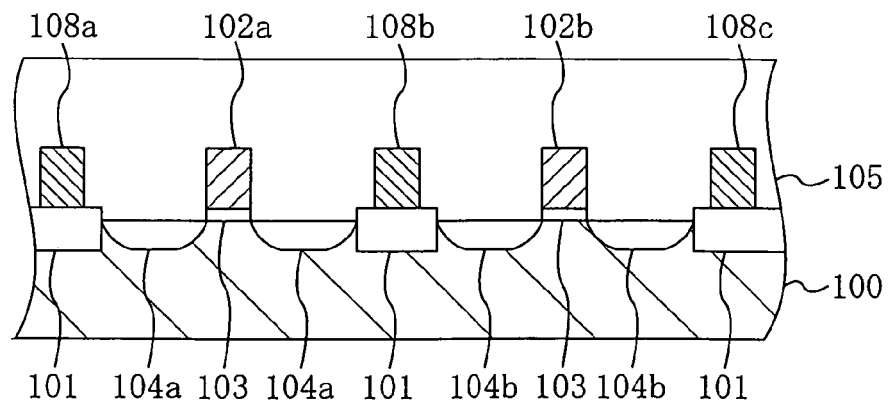

Next, as shown in FIG. 2C, impurity regions 104 are formed in regions of the substrate 100 located to both sides of each gate electrode 102 by ion implantation or the like. Subsequently, a first interlayer insulating film 105 is formed on the substrate 100 by chemical vapor deposition (CVD) or the like.

Figure 3A:
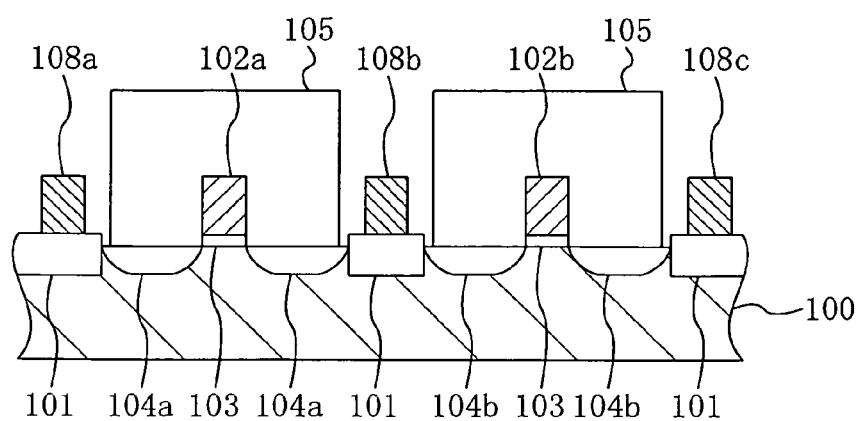
FIGS. 3A and 3B are cross-sectional views showing some of process steps of a method for fabricating a semiconductor device according to the first embodiment of the present invention (until the step of forming a second interlayer insulating film).

Subsequently, parts of the first interlayer insulating film 105 located on the dummy gates 108 and the dummy gates 108 are removed by the known photolithography and etching techniques. In this case, as shown in FIG. 3A, not only the parts of the first interlayer insulating film 105 located on the dummy gates 108 but also parts thereof located at the sides of the dummy gates 108 may be removed.

Figure 3B:
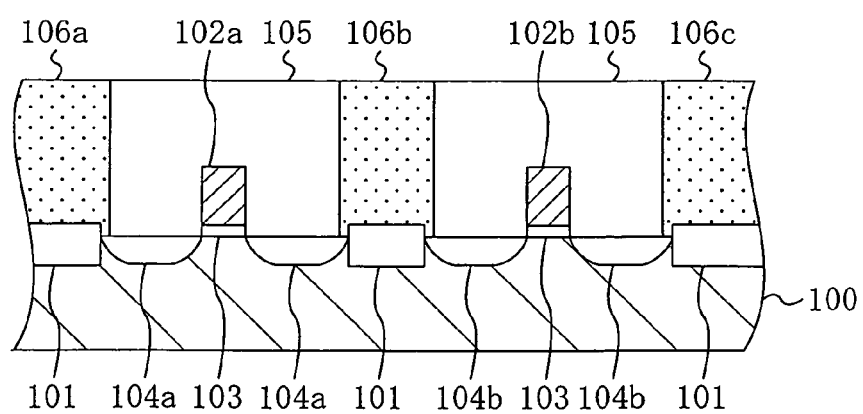

Thereafter, as shown in FIG. 3B, second interlayer insulating films 106 each having a lower relative permeability than the first interlayer insulating film 105 are formed, for example, by CVD, in regions in which the parts of the first interlayer insulating film 105 located on the dummy gates 108 and the dummy gates 108 are removed.

Next, contact holes are formed in the first interlayer insulating film 105 by the known photolithography and etching techniques to reach the impurity regions 104. Finally, contact plugs 107 are formed by filling the contact holes with a refractory metal, such as tungsten, thereby fabricating the semiconductor device shown in FIGS. 1A through 1C.

According to the first embodiment, the formation of the dummy gates 108 reduces the difference in the density of a gate pattern. As a result, the variations in optical proximity effect and etching characteristics due to the difference in the density of the gate pattern are reduced. This reduces variations in the dimensions of finished gates. In addition, the first interlayer insulating film 105 is formed to cover the substrate 100, the isolation region 101, the gate electrodes 102, the gate insulating films 103, the impurity regions 104, and the dummy gates 108. Thereafter, parts of the first interlayer insulating film 105 located on the dummy gates 108 are partly removed, and then the dummy gates 108 that are no longer required after the formation of the gate electrodes 102 are removed.

When as in the known semiconductor device the dummy gates 108 are left without being removed, parasitic capacitances are produced between each dummy gate 108 and each of the neighboring contact plugs 107 and between each dummy gate 108 and each of the neighboring gate electrodes 102, respectively. To be specific, parasitic capacitances are produced, such as between the dummy gate 108a and the gate electrode 102a in FIG. 2C, between the dummy gate 108b and the gate electrode 102a in FIG. 2C, between the dummy gate 108a and the contact plug 107a, and between the dummy gate 108b and the contact plug 107b, respectively.

On the other hand, since in the first embodiment the dummy gates 108 are removed, the parasitic capacitances are not produced. This reduces the parasitic capacitance of a semiconductor device.

In the semiconductor device of the first embodiment, the second interlayer insulating films 106 are formed in the regions in which parts of the first interlayer insulating film 105 and the dummy gates 108 are removed. The second interlayer insulating films 106 are interlayer insulating films each having a lower permeability than the first interlayer insulating film 105. To be specific, while the first interlayer insulating film 105 is formed of, for example, $SiO_2$ having a relative permeability of 4.2, each second interlayer insulating film 106 is formed of, for example, a low-k material, such as SiOC, having a relative permeability of 2.9.

In this relation, a parasitic capacitance is produced between the respective gate electrodes 102 of two adjacent transistors. Since in the first embodiment a part of the first interlayer insulating film 105 and one of the second interlayer insulating films 106 having a low relative permeability are formed between the two gate electrodes 102, the parasitic capacitance is reduced as compared with the case where only the first interlayer insulating film 105 is formed between the two gate electrodes 102.

More specifically, for example, as shown in FIG. 1B, the first interlayer insulating film 105 and the second interlayer insulating film 106b having a low relative permeability are formed between the gate electrode 102a constituting a part of the first NMOS transistor TN1 and the gate electrode 102b constituting a part of the second NMOS transistor TN2. This reduces the parasitic resistance between the gate electrodes 102a and 102b as compared with the case where not both the first interlayer insulating film 105 and the second interlayer insulating film 106b but only the first interlayer insulating film 105 is formed.

Furthermore, a parasitic capacitance is produced between a contact plug 107 of a certain transistor and a contact plug 107 of another transistor adjacent to the transistor. To cope with this, in the first embodiment, each second interlayer insulating film 106 having a low permeability is formed between the two contact plugs 107. This reduces the parasitic capacitance as compared with the case where the first interlayer insulating film 105 is formed between the two second contact plug 107.

More specifically, for example, as shown in FIG. 1C, the second interlayer insulating film 106b having a low permeability is formed between the contact plug 107b constituting a part of the first NMOS transistor TN1 and the contact plug 107c constituting a part of the second NMOS transistor TN2. This reduces the parasitic capacitance between the contact plug 107b and the contact plug 107c as compared with the case where the first interlayer insulating film 105 is formed between the contact plug 107b and the contact plug 107c.

A parasitic fringe capacitance is produced between the contact plugs 107 and the substrate 100 via the second interlayer insulating films 106 and the isolation region 101. Since, however, the second interlayer insulating films 106 each have a low relative permeability, this reduces the parasitic fringe capacitance as compared with the case where, instead of the second interlayer insulating film 106, the first interlayer insulating film 105 is formed. As an example, referring to FIG. 1C, the parasitic fringe capacitance between the contact plug 107a and the substrate 100 is reduced, because the second interlayer insulating film 106b having a low relative permeability is interposed therebetween. Likewise, the parasitic fringe capacitance between the contact plug 107d and the substrate 100 is also reduced, because the second interlayer insulating film 106c is interposed therebetween.

As described above, since in the first embodiment the parasitic capacitance can be reduced, reduction in the speed of a switching operation can be suppressed and the consumed power can be reduced.

In this relation, a material (low-k material) used for the second interlayer insulating films 106 and having a low relative permeability might be inferior in mechanical strength and adhesion to a conventionally used material of an interlayer insulating film, such as $SiO_2$. However, since in the first embodiment the second interlayer insulating films 106 made of a low-k material are locally buried in the first interlayer insulating film 105 made of a conventionally used material, such as $SiO_2$, this ensures reliability.

Furthermore, when the dummy gates 108 are left without being removed, the left dummy gates 108 become floating nodes except in the case where the dummy gates 108 are connected to interconnects. It is preferable that no floating node exists, because floating nodes cause misoperation. According to the first embodiment, the removal of the dummy gates 108 can prevent floating nodes from being produced. This can improve the stability of the operation of the semiconductor device.

As described above, when in the first embodiment the formation of the dummy gates reduces variations in the dimensions of the finished gate electrodes, this provides a semiconductor device realizing a low power consumption and a stable operation.

Figure 6A:
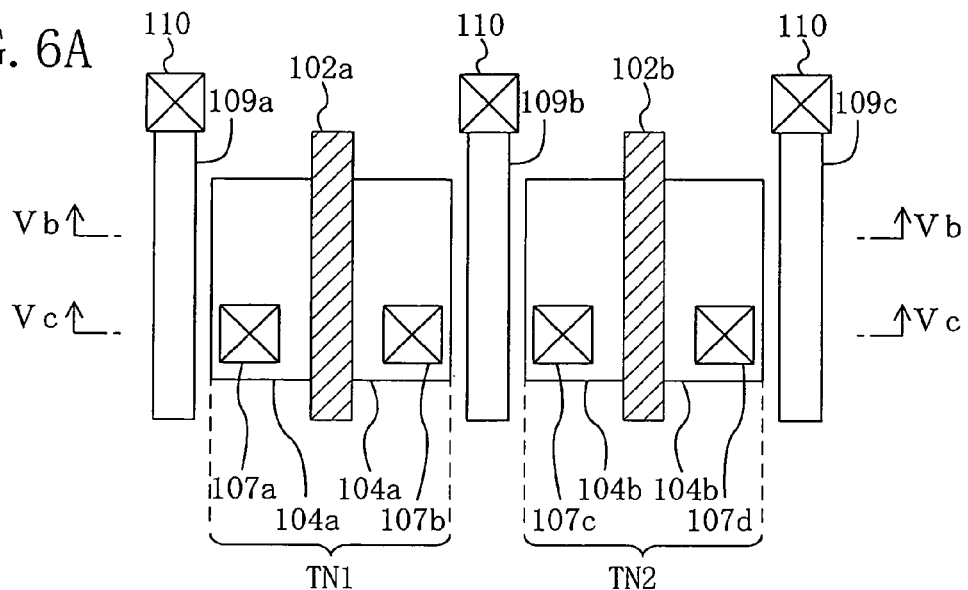
FIGS. 6A through 6C are diagrams showing the structure of a semiconductor device according to the second embodiment of the present invention.
Figure 6B:
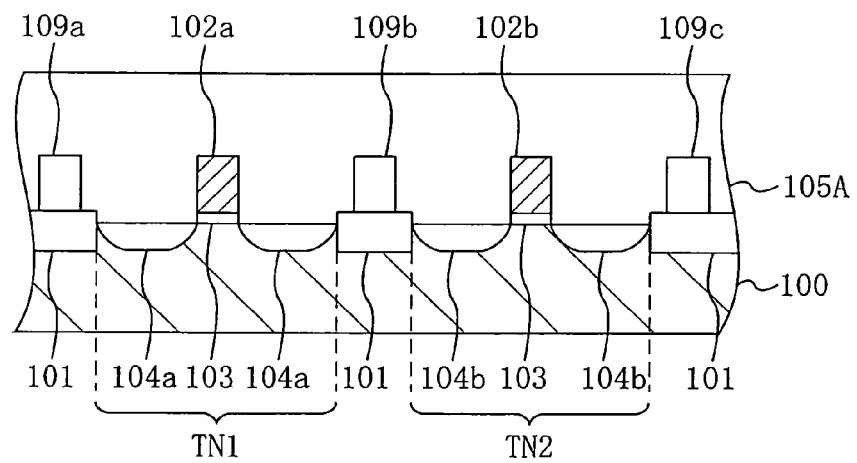
Figure 6C:
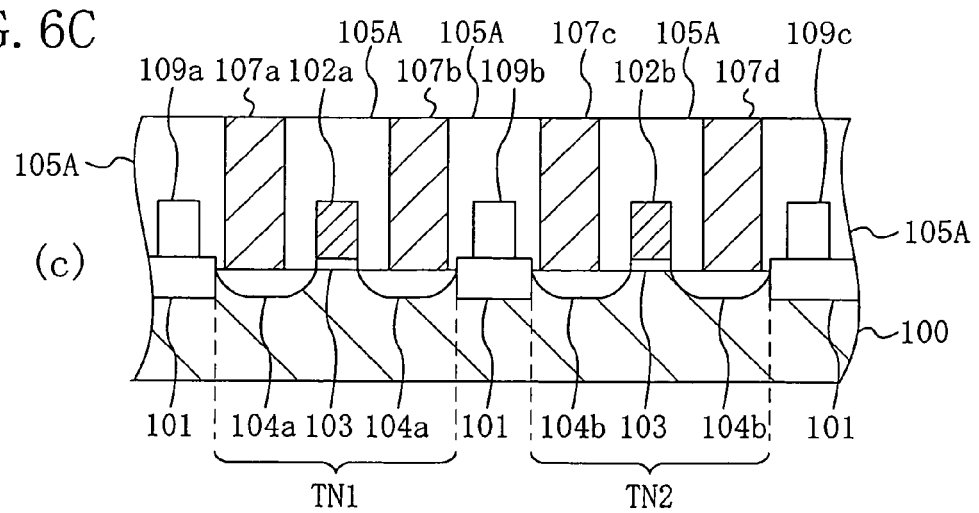

In the first embodiment, the dummy gates 108 are formed on the isolation region 101. It is not always essential that the dummy gates 108 are formed thereon, but the dummy gates 108 may be formed at convenient sites to reduce the difference in the density of the gate pattern. To be specific, the dummy gates 108 may be formed on the impurity regions 104 or across the borders between the isolation region 101 and the impurity regions 104. Furthermore, in the first embodiment, the second interlayer insulating films 106 are formed in the regions in which the dummy gates 108 and parts of the interlayer insulating film 105 are removed and across the borders between the isolation region 101 and the impurity regions 104 as shown in FIGS. 6A through 6C. However, this structure is also not restrictive. More specifically, the second interlayer insulating films 106 may be formed on the isolation region 101 or on the impurity regions 104.

In the first embodiment, when a part of the first interlayer insulating film 105 located on each dummy gate 108 is removed, the removed part of the first interlayer insulating film 105 is wider than a region corresponding to the dummy gate 108 as shown in FIG. 3A. As a result, not only the top surface of the dummy gate 108 but also the side surfaces thereof are exposed. However, this region of the first interlayer insulating film 105 need not necessarily be removed. More particularly, only a region of the interlayer insulating film 105 located on the dummy gate 108 may be removed, and only a region of the interlayer insulating film 105 located on the dummy gate 108 but having a narrower width than the dummy gate 108 may be removed. Although in this embodiment it has been assumed that the interlayer insulating film 105 is partly removed to have the same cross sections even when taken along the width direction of the dummy gate and at any site, the removed part of the interlayer insulating film 105 may have different widths or shapes, or a part of the interlayer insulating film 105 located on the dummy gate 108 may partly be left without being removed.

In the first embodiment, the second interlayer insulating films 106 each have a lower relative permeability than the first interlayer insulating film 105. However, the second interlayer insulating films 106 may each have the same relative permeability as the first interlayer insulating film 105 or each have a higher relative permeability than the first interlayer insulating film 105. Alternatively, the first interlayer insulating film 105 and the second interlayer insulating films 106 may be made of the same material. Since also in such cases the dummy gates 108 can be removed, a high-speed operation and low power consumption can be realized by removing the parasitic capacitances due to the dummy gates 108 and a stable operation can be realized by preventing the floating nodes from being produced.

In the first embodiment, the second interlayer insulating films 106 are formed to be flush with the first interlayer insulating film 105. However, the second interlayer insulating films 106 may each have a shape projecting beyond the first interlayer insulating film 105 or be dented. Alternatively, the second interlayer insulating films 106 may be formed to cover the top surface of the first interlayer insulating film 105.

In the first embodiment, the contact plugs 107 are formed in the first interlayer insulating film 105. However, it is not always essential that the contact plugs 107 are formed therein. The contact plugs 107 may be formed at any site as long as the contact plugs 107 can be connected to the impurity regions 104. To be specific, the contact plugs 107 may be formed in the second interlayer insulating film 106 or across the borders between the first interlayer insulating film 105 and the second interlayer insulating films 106.

Figure 4:
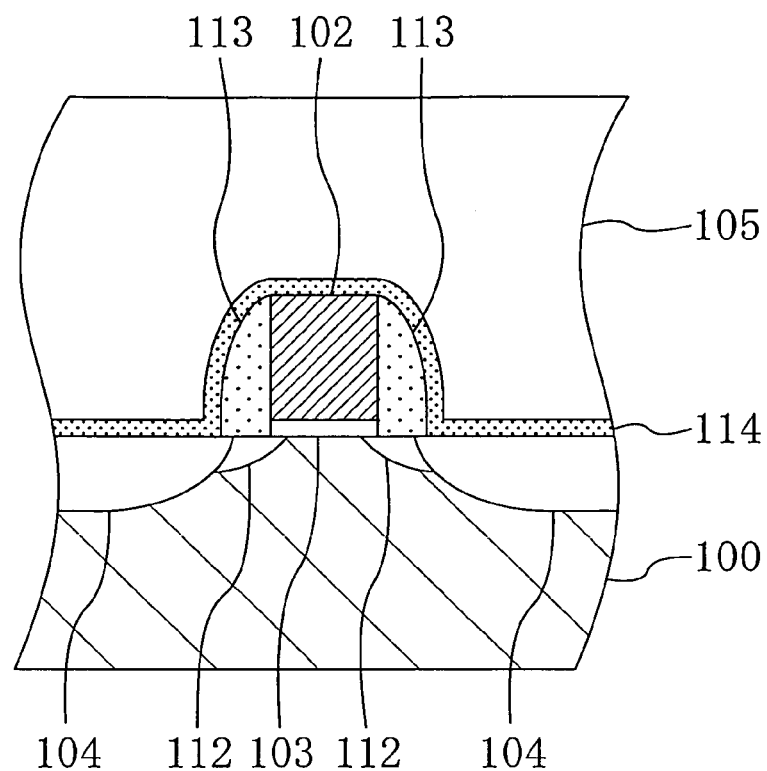
FIG. 4 is a diagram showing the structure of a part of the semiconductor device according to the first or second embodiment of the present invention further comprising lightly doped drain (LDD) regions, sidewalls and a liner layer and located around a gate electrode.

Furthermore, it is preferable that, as shown in FIG. 4, the semiconductor device of the first embodiment further comprises lightly-doped drain (LDD) regions 112 formed in regions of a substrate 100 located to both sides of a gate electrode 102, sidewalls 113 formed at both sides of the gate electrode 102, and a liner layer 114 formed to cover the substrate 100, the gate electrode 102 and the sidewalls 113.

In this relation, impurity regions 104 are formed in regions of the substrate 100 located to both sides of a combination of the gate electrode 102 and the sidewalls 113. In addition, the first interlayer insulating film 105 is formed to cover the substrate 100 and the pattern of the gate electrode 102 and the like.

Thus, the semiconductor device formed with the LDD regions and the sidewalls for the purpose of reducing the short channel effect or other purposes can provide the effect of the present invention.

A description will be given below of a method for fabricating a semiconductor device comprising LDD regions 112, sidewalls 113 and a liner layer 114 as described above.

An isolation region 101 is formed in a substrate 100, and gate electrodes 102, gate insulating films 103, and dummy gates 108 are formed on the substrate 100, using the above-mentioned method for fabricating a semiconductor device shown in FIGS. 2A and 2B that are cross-sectional views showing the method for fabricating a semiconductor device according to the first embodiment.

Next, the LDD regions 112 are formed by ion implantation or the like using each gate electrode 102 as a mask. Furthermore, a Tetra Ethyl Ortho Silicate (TEOS) film or the like is formed to cover the substrate 100, the gate electrode 102 and the like and then etched back by anisotropic etching, thereby forming sidewalls 113.

Subsequently, impurity regions 104 are formed by ion implantation or the like using the gate electrode 102 and the sidewalls 113 as masks.

Thereafter, a liner layer 114 of SiN or the like is formed to cover the substrate 100, the gate electrode 102, the impurity regions 104, the LDD regions 112, and the sidewalls 113.

If the above-mentioned process steps are followed by the process steps of the method for fabricating a semiconductor device according to the first embodiment as shown in FIGS. 2C, 3A and 3B, the semiconductor device of the first embodiment further comprising the LDD regions 112, the sidewalls 113 and the liner layer 114 can be fabricated.

The liner layer 114 is used to form a borderless contact. More particularly, when contact holes are formed by etching the first interlayer insulating film 105, only the first interlayer insulating film 105 is etched on conditions that provide a sufficient selectivity between the first interlayer insulating film 105 and the liner layer 114. In this case, the liner layer 114 is used as an etching stopper. Next, if only the liner layer is opened, contact holes are formed without etching the substrate 100 or the like.

Modification of Embodiment 1

A modification of the first embodiment will be described below.

Figure 5:
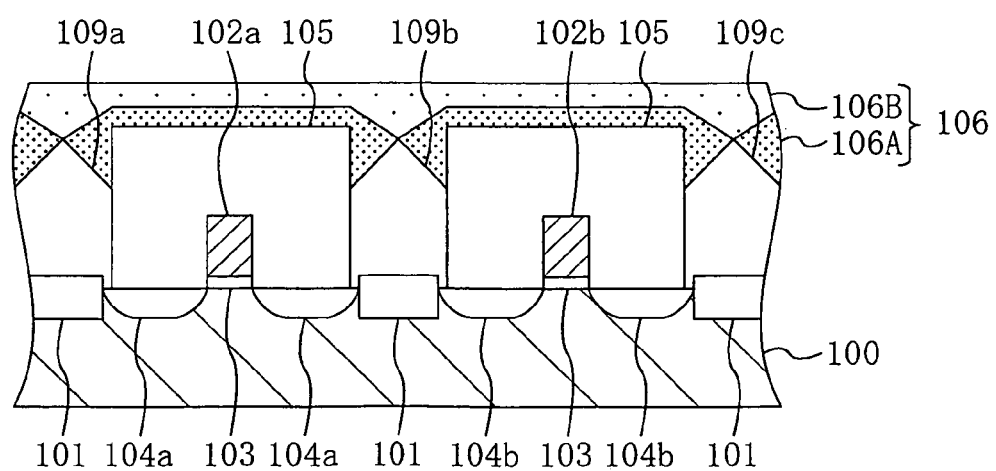
FIG. 5 is a cross-sectional view showing a semiconductor device according to a modification of the first embodiment of the present invention.

In the first embodiment, as shown in FIG. 3B, the second interlayer insulating films 106 are formed to entirely fill regions in which the dummy gates 108 and parts of the first interlayer insulating film 105 are removed. However, second interlayer insulating films 106 may be formed such that hollow regions 109 are formed in the regions in which the dummy gates 108 and parts of the first interlayer insulating film 105 are removed. This state is shown in FIG. 5.

In order to form hollow regions 109, an interlayer insulating film 106A of silicon oxide with high directivity and low coverage is deposited, instead of the second interlayer insulating films 106, by plasma CVD using, for example, a silane gas and a nitrogen monoxide gas and then an interlayer insulating film 106B of silicon oxide with high coverage is deposited by high density plasma CVD.

In this manner, hollow regions 109 are formed to be adjacent to gate electrodes 102 with parts of an interlayer insulating film 105 interposed therebetween when seen along the direction parallel to the principal surface of a substrate 100. To be specific, for a first NMOS transistor TN1, a part of the interlayer insulating film 105 covering a gate electrode 102a of the first NMOS transistor TN1 is interposed between a hollow region 109a located far from a second NMOS transistor TN2 and a hollow region 109b located on one side of the second NMOS transistor TN2. Furthermore, for the second NMOS transistor TN2, a part of the interlayer insulating film 105 covering a gate electrode 102b of the second NMOS transistor TN2 is interposed between the hollow region 109b located on one side of the first NMOS transistor TN1 and a hollow region 109c located far from the first NMOS transistor TN1.

Since the parasitic capacitance is thus reduced as compared with the case where the second interlayer insulating film 106 is formed to entirely fill the regions in which the dummy gates 108 and parts of the first interlayer insulating film 105 are removed, this can reduce the power consumption of a semiconductor device and increase the operation speed thereof. The reason for this is that the relative permeability of a hollow region is almost 1 which is smaller than 2.9, which is the relative permeability of SiOC that is a low-k material.

Although in FIG. 5 the hollow regions 109 are formed across the borders between the isolation region 101 and the impurity regions 104, it is not always essential that the hollow regions 109 are formed at those sites. The hollow regions 109 may be formed at any other sites. To be specific, the hollow regions 109 may be formed on the isolation region 101 or on the impurity regions 104.

Embodiment 2

A second embodiment of the present invention will be described hereinafter with reference to the drawings.

FIGS. 6A through 6C are diagrams showing the structure of a semiconductor device according to the second embodiment of the present invention. FIG. 6A is a plan view showing the same, and FIGS. 6B and 6C are cross-sectional views taken along the line Vb-Vb and the line Vc-Vc in FIG. 6A, respectively.

As shown in FIGS. 6A through 6C, an isolation region 101 is formed in a substrate 100 to section the substrate 100 into a plurality of transistor regions. The isolation region 101 is made of, for example, a $SiO_2$ film. A gate electrode 102 is formed on each transistor region of the substrate 100 with a gate insulating film 103 interposed therebetween. For example, N-type impurity regions 104 serving as source/drain regions are formed in each transistor region of the substrate 100 and to both sides of the gate electrode 102. To be specific, a first NMOS transistor TN1 comprising the gate electrode 102a and the impurity regions 104a and a second NMOS transistor TN2 comprising the gate electrode 102b and the impurity regions 104b are formed in the substrate 100 to be adjacent to each other with the isolation region 101 interposed between the first NMOS transistor TN1 and the second NMOS transistor TN2.

An interlayer insulating film 105A made of, for example, a $SiO_2$ film is formed on the substrate 100 to cover the isolation region 101, the gate electrodes 102, the gate insulating films 103, and the impurity regions 104. Hollow regions 109 are formed so as to be aligned in a direction parallel to the principal surface of the substrate 100 and adjacent to the gate electrodes 102 with parts of the interlayer insulating film 105A interposed therebetween, respectively. To be specific, for the first NMOS transistor TN1, a part of the interlayer insulating film 105A covering the gate electrode 102a of the first NMOS transistor TN1 is interposed between a hollow region 109a located far from the second NMOS transistor TN2 and a hollow region 109b located on one side of the second NMOS transistor TN2. Furthermore, for the second NMOS transistor TN2; a part of the interlayer insulating film 105A covering the gate electrode 102b of the second NMOS transistor TN2 is interposed between the hollow region 109b located on one side of the first NMOS transistor TN1 and a hollow region 109c located far from the first NMOS transistor TN1.

Contact plugs 107 are formed in the first interlayer insulating film 105A to reach the N-type impurity regions 104 of the transistors. To be specific, contact plugs 107a and 107b are formed in the first NMOS transistor TN1 to reach the impurity regions 104a, and contact plugs 107c and 107d are formed in the second NMOS transistor TN2 to reach the impurity regions 104b. The contact plugs 107 each have a structure in which a contact hole is filled with a refractory metal, such as tungsten.

FIGS. 2A through 2C, 7A and 7B are cross-sectional views showing a method for fabricating a semiconductor device according to the second embodiment. In this relation, it is assumed that in the second embodiment the first interlayer insulating film 105 in FIG. 2C is replaced with an interlayer insulating film 105A.

As shown in FIG. 2A, an isolation region 101 is previously formed in a substrate 100 by selective oxidation or the like.

Next, as shown in FIG. 2B, gate insulating films 103 and a conductive film that will be gate electrodes 102 and dummy gates 108 are successively formed on the substrate 100, and thereafter the conductive film is patterned by known photolithography and etching techniques, thereby forming the gate electrodes 102 and the dummy gates 108.

Next, as shown in FIG. 2C, impurity regions 104 are formed in regions of the substrate 100 located to both sides of each gate electrode 102 by ion implantation or the like. Subsequently, an interlayer insulating film 105A is formed, by CVD or the like, on the substrate 100 in which the isolation region 101 and the impurity regions 104 are formed and on which the gate electrodes 102 and the dummy gates 108 are formed.

Figure 7A:
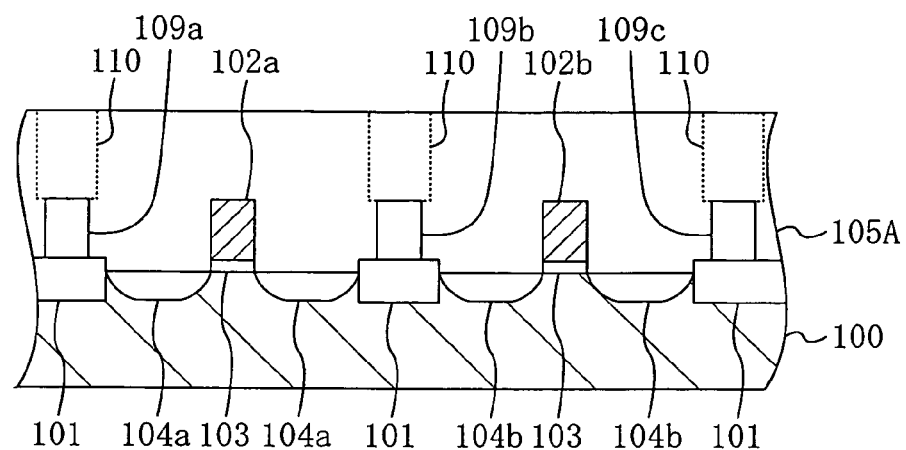
FIGS. 7A and 7B are cross-sectional views showing some of process steps of a method for fabricating a semiconductor device according to the second embodiment of the present invention (until the step of forming a second contact hole).

Subsequently, as shown in FIG. 7A, first contact holes 110 are formed in the interlayer insulating film 105A by known lithography and etching techniques to reach the dummy gates 108.

Furthermore, the dummy gates 108 are removed by a certain method, such as etching through the first contact holes 110. More particularly, for example, an etchant that can dissolve the dummy gates 108 is supplied through the first contact holes 110 to the dummy gates 108, and the etchant after chemical reaction by etching and liquid obtained by dissolving the dummy gates 108 are removed through the first contact holes 110. The use of such a method, such as wet etching, allows the dummy gates 108 to be removed.

In this way, spaces obtained by removing the dummy gates 108 become hollow regions 109.

Figure 7B:
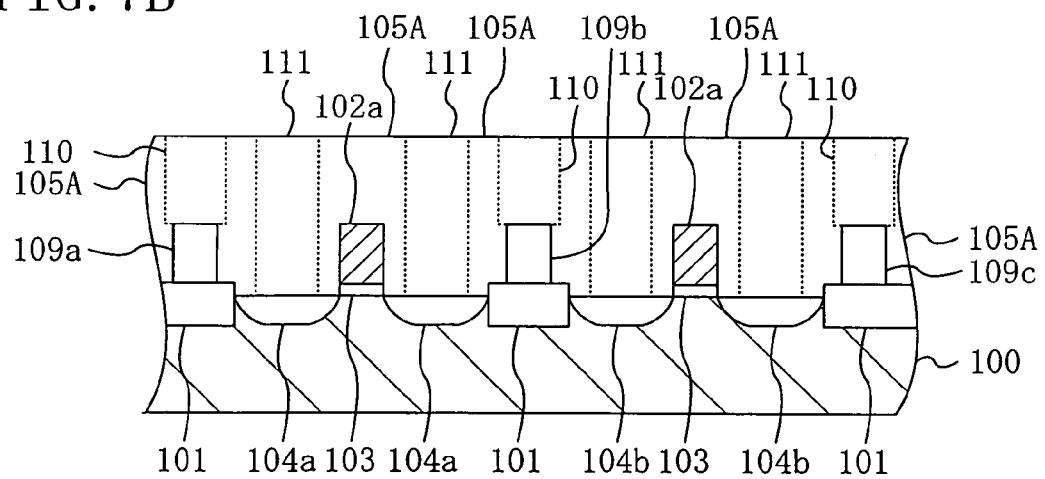
Figure 8A:
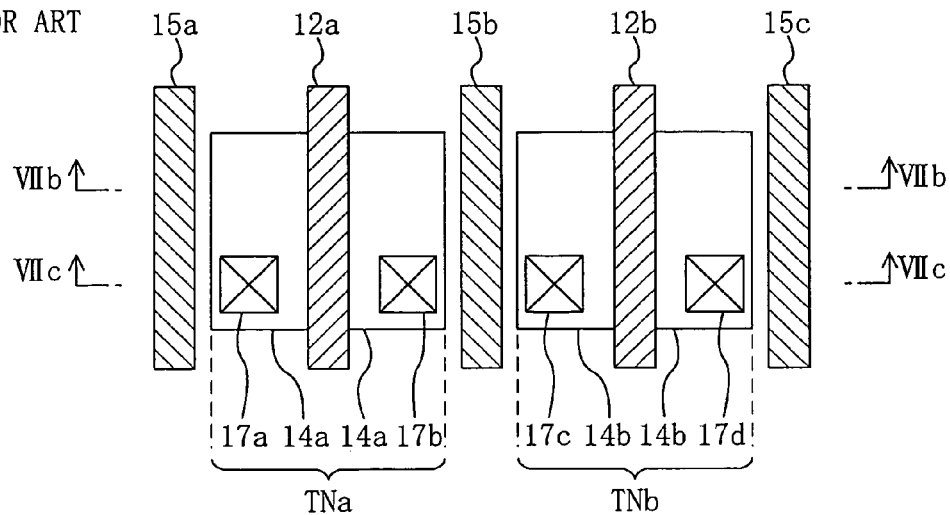
FIGS. 8A through 8C are cross-sectional views showing the structure of a known semiconductor device.
Figure 8B:
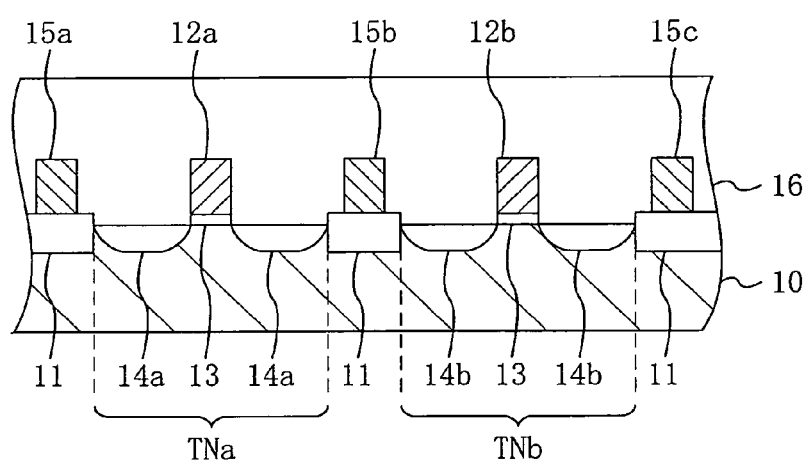
Figure 8C:
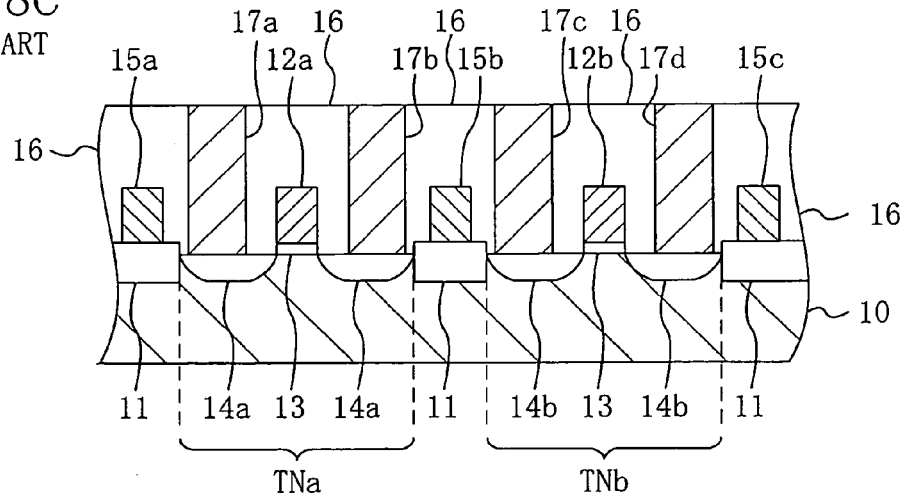
Figure 9:
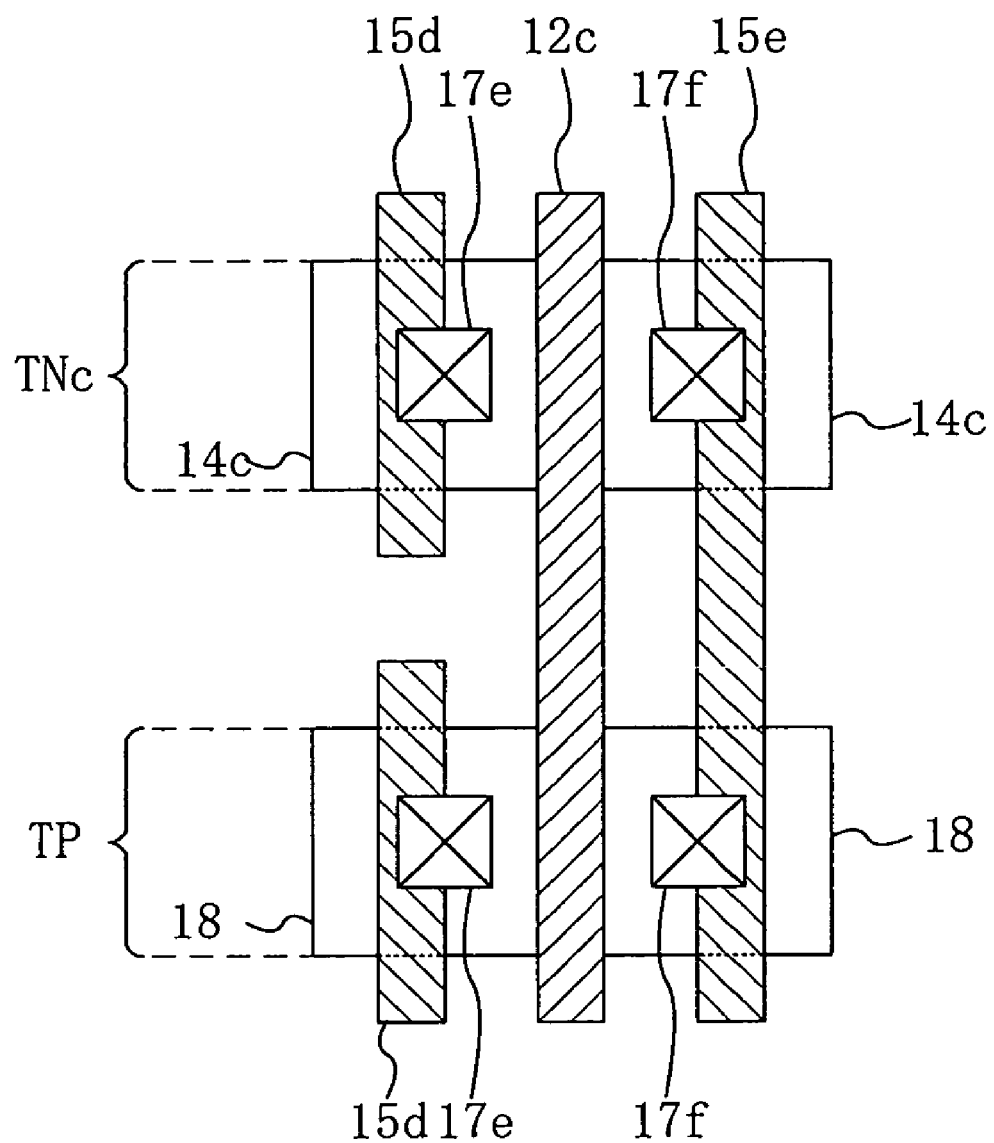
FIG. 9 is a diagram showing the structure of the known semiconductor device.

Thereafter, as shown in FIG. 7B, second contact holes 111 are formed in the interlayer insulating film 105A by known lithography and etching techniques to reach the impurity regions 104. Finally, contact plugs 107 are formed by filling the second contact holes 111 with a refractory metal, such as tungsten, thereby fabricating the semiconductor device shown in FIGS. 6A through 6C.

According to the second embodiment, the formation of the dummy gates 108 reduces the difference in the density of a gate pattern. This reduces the variations in optical proximity effect and etching characteristics due to the difference in the density of the gate pattern. As a result, variations in the dimensions of finished gates are reduced. In addition, the interlayer insulating film 105A is formed to cover the substrate 100, the isolation region 101, the gate electrodes 102, the gate insulating films 103, the impurity regions 104, and the dummy gates 108. Thereafter, the contact holes 110 are formed to reach the dummy gates 108, and then the dummy gates 108 that are no longer required after the formation of the gate electrodes 102 are removed.

When as in the known semiconductor device the dummy gates 108 are left without being removed, parasitic capacitances are produced between each dummy gate 108 and the contact plugs 107 located to both sides of the dummy gate 108 and between each dummy gate 108 and the gate electrodes 102 located to both sides of the dummy gate 108. To be specific, parasitic capacitances are produced, for example, between the dummy gate 108a and the gate electrode 102a, between the dummy gate 108b and the gate electrode 102a, between the dummy gate 108a and the contact plug 107a, and between the dummy gate 108b and the contact plug 107b.

On the other hand, since in the second embodiment the dummy gates 108 are removed, no parasitic capacitance is produced. This reduces the parasitic capacitance of a semiconductor device.

For the semiconductor device of the second embodiment, spaces obtained by removing the dummy gates 108 become hollow regions 109. The relative permeability of each hollow region 109 is almost 1 which is smaller than that of a material of the interlayer insulating film 105A, for example, 4.2 of $SiO_2$.

In this relation, a parasitic capacitance is produced between the respective gate electrodes 102 of adjacent two of transistors. In the second embodiment, the interlayer insulating film 105A is formed between the two gate electrodes 102. Furthermore, the hollow regions 109 are formed in parts of the inside of the interlayer insulating film 105A. Since the relative permeability of each hollow region 109 is smaller than that of the interlayer insulating film 105A, the parasitic capacitance is reduced as compared with the case where the interlayer insulating film 105A is formed also in a region in which the hollow regions 109 are formed.

More specifically, for example, as shown in FIG. 6B, the interlayer insulating film 105A is formed between the gate electrode 102a constituting a part of the first NMOS transistor TN1 and the gate electrode 102b constituting a part of the second NMOS transistor TN2. Furthermore, a hollow region 109b is formed in an internal part of the interlayer insulating film 105A. Since the relative permeability of the hollow region 109b is smaller than that of the interlayer insulating film 105A, the parasitic capacitance is reduced as compared with the case where the interlayer insulating film 105A is formed also in a region in which the hollow region 109b is formed.

Furthermore, a parasitic capacitance is produced between a contact plug 107 of a certain transistor and a contact plug 107 of another transistor adjacent to the transistor. To cope with this, in the second embodiment, the interlayer insulating film 105A is formed between the two contact plugs 107.

Furthermore, the hollow regions 109 are formed in the internal parts of the interlayer insulating film 105A. Since the relative permeability of each hollow region 109 is smaller than that of the interlayer insulating film 105A, the parasitic capacitance is reduced as compared with the case where the interlayer insulating film 105A is formed also in a region in which the hollow region 109 is formed.

More specifically, for example, as shown in FIG. 6C, the interlayer insulating film 105A is formed between the contact plug 107b constituting a part of the first NMOS transistor TN1 and the contact plug 107c constituting a part of the second NMOS transistor TN2. Furthermore, the hollow region 109b is formed in an internal part of the interlayer insulating film 105A. Since the relative permeability of the hollow region 109b is smaller than that of the interlayer insulating film 105A, the parasitic capacitance is reduced as compared with the case where the interlayer insulating film 105A is formed also in a region in which the hollow region 109b is formed.

A parasitic fringe capacitance is produced between each contact plug 107 and the substrate 100 with the interlayer insulating film 105A, the corresponding hollow region 109, and the isolation region 101 interposed therebetween. To cope with this, the hollow region 109 has a low relative permeability. This reduces the parasitic fringe capacitance as compared with the case where the interlayer insulating film 105A is formed also; in a region in which the hollow region 109 is formed. To be specific, for example, as shown in FIG. 6C, the parasitic fringe capacitance between the contact plug 107a and the substrate 100 is reduced, because the hollow region 109a formed inside the interlayer insulating film 105A is interposed therebetween. Likewise, the parasitic fringe capacitance between the contact plug 107d and the substrate 100 is also reduced, because the hollow region 109c is interposed therebetween.

As described above, since in the second embodiment the parasitic capacitance can be reduced, reduction in the speed of a switching operation can be suppressed and the consumed power can be reduced.

Furthermore, when the dummy gates 108 are left without being removed, the left dummy gates 108 become floating nodes except in the case where the dummy gates 108 are connected to interconnects. It is preferable that no floating node exists, because floating nodes cause misoperation. According to the second embodiment, the removal of the dummy gates 108 can prevent floating nodes from being produced. This can improve the stability of the operation of the semiconductor device.

As described above, when in the second embodiment the formation of the dummy gates reduces variations in the dimensions of the finished gate electrodes, this provides a semiconductor device realizing a low power consumption and a stable operation.

In this relation, the formation of the hollow regions 109 might deteriorate mechanical strength and the like. However, since in the second embodiment the hollow regions 109 are locally formed in the interlayer insulating film 105A made of a conventionally used material, such as $SiO_2$, this ensures reliability.

In the second embodiment, after the formation of the first contact holes 110 and the subsequent removal of the dummy gates 108, the second contact holes 111 are formed to reach the impurity regions 104. However, the first contact holes 110 and the second contact holes 111 may be formed in the same process step.

If in this case the dummy gates 108 are removed through the first contact holes 110 and then the contact plugs 107 are formed in the second contact holes 111, this provides the semiconductor device of the second embodiment. This can reduce the number of semiconductor device fabricating process steps as compared with the case where the first contact holes 110 are formed separately from the second contact holes 111.

In the second embodiment, the dummy gates 108 are formed on the isolation region 101. However, it is not always essential that the dummy gates 108 are formed thereon, and the dummy gates 108 may be formed at convenient sites to reduce the difference in the density of the gate pattern. To be specific, the dummy gates 108 may be formed on the impurity regions 104 or across the borders between the isolation region 101 and the impurity regions 104.

As a result, the hollow regions 109 formed by removing the dummy gates 108 may have a structure in which they are formed on the isolation region 101 as shown in FIGS. 6A through 6C or a structure in which they are formed on the impurity regions 104 or across the borders between the isolation region 101 and the impurity regions 104.

In the second embodiment, the contact plugs 107 are formed in the interlayer insulating film 105A. However, it is not always essential that the contact plugs 107 are formed therein. The contact plugs 107 may be formed at any site as long as the contact plugs 107 can be connected to the impurity regions 104. To be specific, the contact plug 107 may be formed in the hollow region 109 and part of the interlayer insulating film 105A located on the hollow regions 109 or across the border between a combination of the hollow region 109 and the part of the interlayer insulating film 105A located on the hollow regions 109 and the interlayer insulating film 105A.

Furthermore, it is preferable that, as shown in FIG. 4, the semiconductor device of the second embodiment also further comprises LDD regions 112, sidewalls 113, and a liner layer 114. In the second embodiment, the first interlayer insulating film 105 is replaced with the interlayer insulating film 105A.

Thus, the semiconductor device of the second embodiment can also provide the same effect as in the case where the semiconductor device of the first embodiment further comprises the LDD regions 112, the sidewalls 113 and the liner layer 114.

The above-described semiconductor device should be fabricated in accordance with the method for fabricating a semiconductor device of the second embodiment as shown in FIGS. 2C, 7A and 7B after the formation of the liner layer 114.

As described above, the present invention is useful as a semiconductor device achieving a high-speed operation, a stable operation and a low power consumption and a method for fabricating the same.

What is claimed is:

1. A semiconductor device comprising:
   a gate electrode formed on a substrate;
   impurity regions formed in the substrate and to both sides of the gate electrode;
   a first interlayer insulating film formed to cover the gate electrode; and
   a second interlayer insulating film formed so as to be aligned in a direction parallel to the principal surface of the substrate and adjacent to the gate electrode with a part of the first interlayer insulating film interposed therebetween,
   wherein the second interlayer insulating film has a lower relative permeability than the first interlayer insulating film.

2. The semiconductor device of claim 1 further comprising:
   LDD (Lightly Doped Drain) regions formed in regions of the substrate located to both sides of the gate electrode;

sidewalls formed on both sides of the gate electrode; and
a liner film formed to cover the substrate, the gate electrode and the sidewalls.

3. The semiconductor device of claim 1, wherein
the second interlayer insulating film is formed on the impurity region.

4. The semiconductor device of claim 1, wherein
contact plugs are formed in the first interlayer insulating film to reach the impurity regions.

5. The semiconductor device of claim 1, wherein
contact plugs are formed in the second interlayer insulating film to reach the impurity regions.

6. The semiconductor device of claim 1, wherein
contact plugs are formed across the border between the first interlayer insulating film and the second interlayer insulating film to reach the impurity regions.

7. The semiconductor device of claim 1 further comprising
an isolation region formed in the substrate to surround the impurity regions.

8. The semiconductor device of claim 7, wherein
the second interlayer insulating film is formed on the isolation region.

9. The semiconductor device of claim 7, wherein
the second interlayer insulating film is formed across the border between the impurity region and the isolation region.

10. A semiconductor device comprising:
a gate electrode formed on a substrate;
impurity regions formed in the substrate and to both sides of the gate electrode;
an interlayer insulating film formed to cover the gate electrode;
a hollow region formed so as to be aligned in a direction parallel to the principal surface of the substrate and adjacent to the gate electrode with a part of the interlayer insulating film interposed therebetween; and
an isolation region formed in the substrate to surround the impurity regions,
wherein the hollow region is formed on the isolation region.

11. The semiconductor device of claim 10, wherein
contact plugs are formed in the interlayer insulating film to reach the impurity regions.

12. A semiconductor device comprising:
a gate electrode formed on a substrate;
impurity regions formed in the substrate and to both sides of the gate electrode;
an interlayer insulating film formed to cover the gate electrode;
a hollow region formed so as to be aligned in a direction parallel to the principal surface of the substrate and adjacent to the gate electrode with a part of the interlayer insulating film interposed therebetween; and
an isolation region formed in the substrate to surround the impurity regions,
wherein the hollow region is formed across the border between the impurity region and the isolation region.

13. The semiconductor device of claim 12, wherein
contact plugs are formed in the interlayer insulating film to reach the impurity regions.

14. A semiconductor device comprising:
a gate electrode formed on a substrate;
impurity regions formed in the substrate and to both sides of the gate electrode;
an interlayer insulating film formed to cover the gate electrode; and
a hollow region formed so as to be aligned in a direction parallel to the principal surface of the substrate and adjacent to the gate electrode with a part of the interlayer insulating film interposed therebetween,
wherein the hollow region is formed on the impurity region, and
wherein contact plugs are formed in the interlayer insulating film to reach the impurity regions.

15. A semiconductor device comprising:
a gate electrode formed on a substrate;
impurity regions formed in the substrate and to both sides of the gate electrode;
an interlayer insulating film formed to cover the gate electrode; and
a hollow region formed so as to be aligned in a direction parallel to the principal surface of the substrate and adjacent to the gate electrode with a part of the interlayer insulating film interposed therebetween,
wherein a contact plug is formed in the hollow region and a part of the interlayer insulating film located on the hollow region to reach the impurity region.

16. A semiconductor device comprising:
a gate electrode formed on a substrate;
impurity regions formed in the substrate and to both sides of the gate electrode;
an interlayer insulating film formed to cover the gate electrode; and
a hollow region formed so as to be aligned in a direction parallel to the principal surface of the substrate and adjacent to the gate electrode with a part of the interlayer insulating film interposed therebetween,
wherein a contact plug is formed across the border between a combination of the hollow region and a part of the interlayer insulating film located on the hollow region and the interlayer insulating film to reach the impurity region.

* * * * *